United States Patent
Hamamoto et al.

(10) Patent No.: US 9,377,679 B2
(45) Date of Patent: Jun. 28, 2016

(54) REFLECTIVE MASK BLANK AND METHOD FOR MANUFACTURING SAME, METHOD FOR MANUFACTURING REFLECTIVE MASK, AND METHOD FOR MANUFACTURING SEMICONDUCTOR DEVICE

(71) Applicant: HOYA CORPORATION, Shinjuku-ku, Tokyo (JP)

(72) Inventors: Kazuhiro Hamamoto, Tokyo (JP); Tatsuo Asakawa, Tokyo (JP); Osamu Maruyama, Tokyo (JP); Tsutomu Shoki, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/418,629

(22) PCT Filed: Jul. 27, 2013

(86) PCT No.: PCT/JP2013/070398
§ 371 (c)(1),
(2) Date: Jan. 30, 2015

(87) PCT Pub. No.: WO2014/021235
PCT Pub. Date: Feb. 6, 2014

(65) Prior Publication Data
US 2015/0301441 A1 Oct. 22, 2015

(30) Foreign Application Priority Data
Jul. 31, 2012 (JP) ................. 2012-169897

(51) Int. Cl.
*G03F 1/24* (2012.01)
*G03F 1/48* (2012.01)
(52) U.S. Cl.
CPC ... *G03F 1/24* (2013.01); *G03F 1/48* (2013.01)
(58) Field of Classification Search
CPC .................................... G03F 1/24; G03F 1/48
USPC ........................................................ 430/5, 311
See application file for complete search history.

(56) References Cited

U.S. PATENT DOCUMENTS

| | | | |
|---|---|---|---|
| 2003/0077523 A1 | 4/2003 | Hata et al. |
| 2006/0177776 A1 | 8/2006 | Matsunaga et al. |
| 2007/0160916 A1 | 7/2007 | Ikuta et al. |
| 2007/0196774 A1 | 8/2007 | Fujiwara et al. |

FOREIGN PATENT DOCUMENTS

| | | |
|---|---|---|
| JP | 2004-335845 A | 11/2004 |
| JP | 3607903 B2 | 1/2005 |
| JP | 2005-316448 A | 11/2005 |
| JP | 2006-186112 A | 7/2006 |
| JP | 2009-523311 A | 6/2009 |
| JP | 4862892 B2 | 1/2012 |
| WO | 2006/009169 A1 | 1/2006 |
| WO | 2007/138747 A1 | 12/2007 |

OTHER PUBLICATIONS

International Search Report of PCT/JP2013/070398 dated Oct. 1, 2013 [PCT/ISA/210].

*Primary Examiner* — Christopher Young
(74) *Attorney, Agent, or Firm* — Sughrue Mion, PLLC

(57) ABSTRACT

This invention provides a reflective mask blank capable of preventing peeling-off of a multilayer reflective film due to cleaning or the like in a mask manufacturing process or during mask use. The reflective mask blank includes a multilayer reflective film, a protective film, an absorber film, and a resist film formed in this order on a substrate. Assuming that a distance from the center of the substrate to an outer peripheral end of the multilayer reflective film is L(ML), that a distance from the center of the substrate to an outer peripheral end of the protective film is L(Cap), that a distance from the center of the substrate to an outer peripheral end of the absorber film is L(Abs), and that a distance from the center of the substrate to an outer peripheral end of the resist film is L(Res), L(Abs)>L(Res)>L(Cap)≥L(ML) and the outer peripheral end of the resist film is located inward of an outer peripheral end of the substrate.

19 Claims, 5 Drawing Sheets

REFLECTIVE MASK BLANK AND METHOD FOR MANUFACTURING SAME, METHOD FOR MANUFACTURING REFLECTIVE MASK, AND METHOD FOR MANUFACTURING SEMICONDUCTOR DEVICE

CROSS REFERENCE TO RELATED APPLICATIONS

This application is a National Stage of International Application No. PCT/JP2013/070398, filed Jul. 27, 2013, claiming priority based on Japanese Patent Application No. 2012-169897, filed Jul. 31, 2012, the contents of all of which are incorporated herein by reference in their entirety.

TECHNICAL FIELD

This invention relates to a reflective mask blank for use in the manufacture of semiconductor devices or the like, a method of manufacturing the same, a method of manufacturing a reflective mask, and a method of manufacturing a semiconductor device.

BACKGROUND ART

Generally, fine pattern formation is carried out by the photolithography in manufacturing processes of a semiconductor device. A number of transfer masks called photomasks are usually used for this fine pattern formation. The transfer mask includes generally a transparent glass substrate having thereon a fine pattern made of a metal thin film or the like. The photolithography is used also in the manufacture of the transfer mask.

As a type of transfer mask, a phase shift mask is known apart from a conventional binary mask having a light-shielding film pattern made of a chromium-based material on a transparent substrate. This phase shift mask is of a structure having a phase shift film on a transparent substrate. This phase shift film is configured to provide a predetermined phase difference and is made of, for example, a material containing a molybdenum silicide compound or the like. Further, use has also been made of a binary mask using, as a light-shielding film, a material containing a metal silicide compound such as a molybdenum silicide compound.

In recent years, with higher integration of semiconductor devices, patterns finer than the transfer limit of the photolithography using the conventional ultraviolet light have been required in the semiconductor industry. In order to enable the formation of such fine patterns, the EUV lithography being an exposure technique using extreme ultraviolet (Extreme Ultra Violet: hereinafter referred to as "EUV") light is expected to be promising. Herein, the EUV light represents light in a wavelength band of the soft X-ray region or the vacuum ultraviolet region and, specifically, light having a wavelength of about 0.2 to 100 nm. A reflective mask has been proposed as a mask for use in the EUV lithography. In the reflective mask, a multilayer reflective film configured to reflect exposure light is formed on a substrate and an absorber film configured to absorb exposure light is formed in a pattern on the multilayer reflective film.

The photolithography is used also in the manufacture of the reflective mask. For example, Patent Document 1 discloses a typical structure of a reflective mask blank for use in the manufacture of a reflective mask.

PRIOR ART DOCUMENT

Patent Document

Patent Document 1: Japanese Patent (JP-B) No. 4862892

SUMMARY OF THE INVENTION

Problem to be Solved by the Invention

As disclosed in the above-mentioned Patent Document 1, the typical structure of the reflective mask blank is that a multilayer reflective film configured to reflect exposure light (EUV light) is formed on one of main surfaces of a substrate and that an absorber film configured to absorb exposure light (EUV light) is formed on the multilayer reflective film.

When manufacturing a reflective mask using such a reflective mask blank, first, a resist film for electron beam writing is formed on a surface of the reflective mask blank. Then, the resist film is subjected to desired electron beam writing and to development, thereby forming a resist pattern. Then, using the resist pattern as a mask, the absorber film is dry-etched to form an absorber film pattern (transfer pattern). Consequently, a reflective mask having a structure in which the absorber film is formed in a pattern on the multilayer reflective film is completed.

In the meantime, usually, the multilayer reflective film and the absorber film in the reflective mask blank are formed using an ion-beam sputtering apparatus or a DC magnetron sputtering apparatus and each of the multilayer reflective film and the absorber film is formed over the entire main surface of the substrate and further formed to extend over part of an end face of the substrate. While the resist film is formed on the entire surface of the reflective mask blank, the resist film at a substrate peripheral edge portion where a mask pattern will not be formed is usually removed in order to suppress the occurrence of dust due to peeling-off of the resist film at the substrate peripheral edge portion.

When the reflective mask is manufactured in the above-described manner using the reflective mask blank in the state where the resist film at the substrate peripheral edge portion is removed as described above (in other words, the resist film is not formed at the substrate peripheral edge portion), since the resist film is not formed at the substrate peripheral edge portion, the exposed absorber film is removed by etching so that the multilayer reflective film is exposed. Usually, in the manufacturing process of the reflective mask, wet cleaning using an acidic or alkaline aqueous solution (chemical solution) is carried out for removal of the resist pattern and so on after forming the absorber film pattern. In addition, also in the manufacture of semiconductor devices, wet cleaning using a chemical solution is carried out for removal of foreign matter that has adhered to the reflective mask during exposure. Such cleaning is carried out at least a plurality of times. As the multilayer reflective film for EUV light having a wavelength of 13 to 14 nm, use is preferably made of a Mo/Si cycle multilayer film in which Mo films and Si films are alternately laminated by about 40 cycles. The present inventors have found that the multilayer reflective film exposed at the substrate peripheral edge portion is damaged to cause its peeling-off due to such cleaning. There is a possibility that such peeling-off of the multilayer reflective film may cause a serious pattern defect.

This invention has been made in view of such conventional problems and its object is, first, to provide a reflective mask blank capable of preventing peeling-off of a multilayer reflective film due to cleaning or the like in a mask manufacturing process or during mask use, a method of manufacturing such a reflective mask blank, and a method of manufacturing a reflective mask using such a reflective mask blank, and, second, to provide a method of manufacturing a semiconductor device, which uses such a reflective mask and thus can eliminate the occurrence of a defect due to peeling-off of the multilayer reflective film.

Means for Solving the Problem

In order to solve the above-described problems, the present inventors have paid attention particularly to forming regions of films that constitute a reflective mask blank and to a forming region of a resist film that is formed on a surface of the reflective mask blank and, as a result of intensive studies, have found that, according to the following structure of this invention, a multilayer reflective film is not exposed after a mask is manufactured and thus that it is possible to prevent peeling-off of the multilayer reflective film due to cleaning or the like in a mask manufacturing process or during mask use and to eliminate the occurrence of a defect due to peeling-off of the multilayer reflective film.

Specifically, in order to solve the above-described problems, this invention has the following structures.

(Structure 1)

A reflective mask blank, includes:

a multilayer reflective film formed on a substrate to reflect EUV light;

a protective film formed on the multilayer reflective film to protect the multilayer reflective film;

an absorber film formed on the protective film to absorb the EUV light; and a resist film formed on the absorber film;

wherein:

when a distance from a center of the substrate to an outer peripheral end of the multilayer reflective film is L(ML), a distance from the center of the substrate to an outer peripheral end of the protective film is L(Cap), a distance from the center of the substrate to an outer peripheral end of the absorber film is L(Abs), and a distance from the center of the substrate to an outer peripheral end of the resist film is L(Res), L(Abs)>L(Res)>L(Cap)≥L(ML) is satisfied and the outer peripheral end of the resist film is located inward of an outer peripheral end of the substrate.

According to the reflective mask blank of the Structure 1, after a reflective mask is manufactured using this reflective mask blank, the multilayer reflective film is not exposed at a substrate peripheral edge portion where an absorber film pattern is not formed. Therefore, it is possible to prevent peeling-off of the multilayer reflective film due to cleaning or the like in a mask manufacturing process or during mask use and to eliminate the occurrence of a defect due to peeling-off of the multilayer reflective film.

(Structure 2)

A reflective mask blank, includes:

a multilayer reflective film formed on a substrate to reflect EUV light;

a protective film formed on the multilayer reflective film to protect the multilayer reflective film;

an absorber film formed on the protective film to absorb the EUV light; and a resist film formed on the absorber film;

wherein:

when a distance from a center of the substrate to an outer peripheral end of the multilayer reflective film is L(ML), a distance from the center of the substrate to an outer peripheral end of the protective film is L(Cap), a distance from the center of the substrate to an outer peripheral end of the absorber film is L(Abs), and a distance from the center of the substrate to an outer peripheral end of the resist film is L(Res), L(Abs)≥L(Cap)>L(Res)>L(ML) is satisfied and the outer peripheral end of the resist film is located inward of an outer peripheral end of the substrate.

According to the reflective mask blank of the Structure 2, after a reflective mask is manufactured using this reflective mask blank, the multilayer reflective film is not exposed at a substrate peripheral edge portion where an absorber film pattern is not formed. Therefore, it is possible to prevent peeling-off of the multilayer reflective film due to cleaning or the like in a mask manufacturing process or during mask use and to eliminate the occurrence of a defect due to peeling-off of the multilayer reflective film.

(Structure 3)

The reflective mask blank according to Structure 1 or 2, wherein a conductive film is formed on the substrate of a side opposite to a side where the multilayer reflective film is formed, and wherein: when a distance from the center of the substrate to an outer peripheral end of the conductive film is L(BL), L(BL)>L(Res) is satisfied.

According to the reflective mask blank of the Structure 3, after a reflective mask is manufactured using this reflective mask blank, when manufacturing a semiconductor device by holding a back surface of the reflective mask using an electrostatic chuck and transferring a pattern to a transfer target substrate by an EUV exposure apparatus, even if light in the vacuum ultraviolet region, other than EUV light, is incident on a substrate peripheral edge portion, where an absorber film pattern of the reflective mask is not formed and the substrate is exposed, and enters the substrate, since the conductive film is formed on the back surface of the substrate, the light in the vacuum ultraviolet region is not irradiated to the electrostatic chuck of the EUV exposure apparatus. Therefore, it is possible to prevent damage to the electrostatic chuck due to such light.

(Structure 4)

The reflective mask blank according to Structure 3, wherein a reflection reducing layer for reducing reflection of light having a wavelength in a vacuum ultraviolet region is formed on a substrate side of the conductive film.

According to the reflective mask blank of the Structure 4, after a reflective mask is manufactured using this reflective mask blank, when manufacturing a semiconductor device by holding a back surface of the reflective mask using an electrostatic chuck and transferring a pattern to a transfer target substrate by an EUV exposure apparatus, even if light in the vacuum ultraviolet region, other than EUV light, is incident on a substrate peripheral edge portion, where an absorber film pattern of the reflective mask is not formed and the substrate is exposed, and enters the substrate, since the reflection reducing layer configured to reduce reflection of light having a wavelength in the vacuum ultraviolet region is formed on the back surface of the substrate, there does not arise a problem that an unnecessary resist on the transfer target substrate is sensitized to cause degradation of pattern accuracy.

(Structure 5)

The reflective mask blank according to any of Structures 1 to 4, wherein the protective film is made of an alloy of at least two kinds of metals including ruthenium (Ru) and the alloy is a complete solid solution.

According to the Structure 5, the protective film is made of an alloy of at least two kinds of metals including ruthenium (Ru) and the alloy is a complete solid solution. Consequently, the loss of the protective film due to, for example, dry etching with a chlorine-based gas used for dry-etching a Ta-based material or due to chemical cleaning or the like in a mask manufacturing process or during mask use becomes very small. In particular, since the loss of the protective film exposed at a substrate peripheral edge portion where an absorber film pattern is not formed is suppressed, it is possible to prevent exposure and peeling-off of the underlying multilayer reflective film.

(Structure 6)

A method of manufacturing a reflective mask blank, the reflective mask blank including a multilayer reflective film formed on a substrate to reflect EUV light; a protective film formed on the multilayer reflective film to protect the multilayer reflective film; an absorber film formed on the protective film to absorb the EUV light; and a resist film formed on the absorber film;

wherein:

when a distance from a center of the substrate to an outer peripheral end of the multilayer reflective film is L(ML), a distance from the center of the substrate to an outer peripheral end of the protective film is L(Cap), a distance from the center of the substrate to an outer peripheral end of the absorber film is L(Abs), and a distance from the center of the substrate to an outer peripheral end of the resist film is L(Res), the multilayer reflective film, the protective film, the absorber film, and the resist film are respectively formed so that L(Abs)>L(Res)>L(Cap)≥L(ML) is satisfied and that the outer peripheral end of the resist film is located inward of an outer peripheral end of the substrate.

According to the Structure 6, after a reflective mask is manufactured using the obtained reflective mask blank, the multilayer reflective film is not exposed at a substrate peripheral edge portion where an absorber film pattern is not formed. Therefore, it is possible to prevent peeling-off of the multilayer reflective film due to cleaning or the like in a mask manufacturing process or during mask use and to eliminate the occurrence of a defect due to peeling-off of the multilayer reflective film.

(Structure 7)

A method of manufacturing a reflective mask blank, the reflective mask blank including a multilayer reflective film formed on a substrate to reflect EUV light; a protective film formed on the multilayer reflective film to protect the multilayer reflective film; an absorber film formed on the protective film to absorb the EUV light; and a resist film formed on the absorber film;

wherein:

when a distance from a center of the substrate to an outer peripheral end of the multilayer reflective film is L(ML), a distance from the center of the substrate to an outer peripheral end of the protective film is L(Cap), a distance from the center of the substrate to an outer peripheral end of the absorber film is L(Abs), and a distance from the center of the substrate to an outer peripheral end of the resist film is L(Res), the multilayer reflective film, the protective film, the absorber film, and the resist film are respectively formed so that L(Abs)≥L(Cap)>L(Res)>L(ML) is satisfied and that the outer peripheral end of the resist film is located inward of an outer peripheral end of the substrate.

According to the Structure 7, after a reflective mask is manufactured using the obtained reflective mask blank, the multilayer reflective film is not exposed at a substrate peripheral edge portion where an absorber film pattern is not formed. Therefore, it is possible to prevent peeling-off of the multilayer reflective film due to cleaning or the like in a mask manufacturing process or during mask use and to eliminate the occurrence of a defect due to peeling-off of the multilayer reflective film.

(Structure 8)

The method of manufacturing a reflective mask blank according to Structure 6 or 7, wherein the multilayer reflective film, the protective film, and the absorber film are formed by sputtering by providing a shielding member so as to be spaced apart from a peripheral edge portion of the substrate.

According to the Structure 8, the multilayer reflective film, the protective film, and the absorber film are each formed by sputtering by providing the shielding member so as to be spaced apart from the peripheral edge portion of the substrate. Consequently, it is possible to reliably obtain the reflective mask blank having the structure recited in the Structure 6 or 7.

(Structure 9)

The method of manufacturing a reflective mask blank according to any of Structures 6 to 8, wherein a conductive film is formed on the substrate of a side opposite to a side where the multilayer reflective film is formed, and wherein:

when a distance from the center of the substrate to an outer peripheral end of the conductive film is L(BL), L(BL)>L(Res) is satisfied.

According to the Structure 9, after a reflective mask is manufactured using this reflective mask blank, when manufacturing a semiconductor device by holding a back surface of the reflective mask using an electrostatic chuck and transferring a pattern to a transfer target substrate by an EUV exposure apparatus, even if light in the vacuum ultraviolet region, other than EUV light, is incident on a substrate peripheral edge portion, where an absorber film pattern of the reflective mask is not formed and the substrate is exposed, and enters the substrate, since the conductive film is formed on the back surface of the substrate, the light in the vacuum ultraviolet region is not irradiated to the electrostatic chuck of the EUV exposure apparatus. Therefore, it is possible to prevent damage to the electrostatic chuck due to such light.

(Structure 10)

The method of manufacturing a reflective mask blank according to Structure 9, wherein the conductive film is formed by sputtering by providing a shielding member so as to be spaced apart from a peripheral edge portion of the substrate.

According to the Structure 10, the conductive film is formed by sputtering by providing the shielding member so as to be spaced apart from the peripheral edge portion of the substrate. Consequently, it is possible to reliably obtain the reflective mask blank having the structure recited in the Structure 9.

(Structure 11)

The method of manufacturing a reflective mask blank according to Structure 9 or 10, wherein a reflection reducing layer for reducing reflection of light having a wavelength in a vacuum ultraviolet region is formed on a substrate side of the conductive film.

According to the Structure 11, after a reflective mask is manufactured using this reflective mask blank, when manufacturing a semiconductor device by holding a back surface of the reflective mask using an electrostatic chuck and transferring a pattern to a transfer target substrate by an EUV exposure apparatus, even if light in the vacuum ultraviolet region, other than EUV light, is incident on a substrate peripheral edge portion, where an absorber film pattern of the reflective mask is not formed and the substrate is exposed, and enters the substrate, since the reflection reducing layer configured to reduce reflection of light having a wavelength in the vacuum ultraviolet region is formed on the back surface of the substrate, there does not arise a problem that an unnecessary resist on the transfer target substrate is sensitized to cause degradation of pattern accuracy.

(Structure 12)

The method of manufacturing a reflective mask blank according to any of Structures 6 to 11, wherein the protective film is made of an alloy of at least two kinds of metals including ruthenium (Ru) and the alloy is a complete solid solution.

According to the Structure 12, the protective film is made of an alloy of at least two kinds of metals including ruthenium (Ru) and the alloy is a complete solid solution. Consequently, the loss of the protective film due to, for example, dry etching with a chlorine-based gas used for dry-etching a Ta-based material or due to chemical cleaning or the like in a mask manufacturing process or during mask use becomes very small. In particular, since the loss of the protective film exposed at a substrate peripheral edge portion where an absorber film pattern is not formed is suppressed, it is possible to prevent exposure and peeling-off of the underlying multilayer reflective film.

(Structure 13)

A method of manufacturing a reflective mask, includes:

using the reflective mask blank according to any of Structures 1 to 5 or the reflective mask blank obtained by the method of manufacturing the reflective mask blank according to any of Structures 6 to 12, a step of forming a resist pattern in the resist film; and a step of patterning the absorber film by using the resist pattern as a mask.

By manufacturing a reflective mask using the reflective mask blank having the structure described above, the multilayer reflective film is not exposed at a substrate peripheral edge portion where an absorber film pattern is not formed. Therefore, it is possible to prevent peeling-off of the multilayer reflective film due to cleaning or the like in a mask manufacturing process or during mask use and to eliminate the occurrence of a defect due to peeling-off of the multilayer reflective film.

Further, by manufacturing a reflective mask using the reflective mask blank having the structure described above, when manufacturing a semiconductor device by holding a back surface of the reflective mask using an electrostatic chuck and transferring a pattern to a transfer target substrate by an EUV exposure apparatus, even if light in the vacuum ultraviolet region, other than EUV light, is incident on a substrate peripheral edge portion, where an absorber film pattern of the reflective mask is not formed and the substrate is exposed, and enters the substrate, since the conductive film is formed on the back surface of the substrate and preferably the reflection reducing layer configured to reduce reflection of light having a wavelength in the vacuum ultraviolet region is formed on the surface, on the substrate side, of the conductive film, the light in the vacuum ultraviolet region is not irradiated to the electrostatic chuck of the EUV exposure apparatus and there does not arise a problem that an unnecessary resist on the transfer target substrate is sensitized by reflected light due to the conductive film to cause degradation of pattern accuracy.

(Structure 14)

A method of manufacturing a semiconductor device, includes:

a step of forming a transfer pattern in a resist film on a semiconductor substrate by using the reflective mask obtained by the method of manufacturing the reflective mask according to Structure 13.

By manufacturing a semiconductor device using the reflective mask described above, it is possible to eliminate the occurrence of a defect due to peeling-off of the multilayer reflective film of the reflective mask so that a high-quality semiconductor device can be obtained. Further, it is prevented that an unnecessary resist on a transfer target substrate is sensitized by reflected light due to the conductive film. Therefore, there occurs no degradation of pattern accuracy so that a high-quality semiconductor device can be obtained.

Effect of the Invention

According to this invention, it is possible to provide a reflective mask blank capable of preventing peeling-off of a multilayer reflective film due to cleaning or the like in a mask manufacturing process or during mask use, a method of manufacturing such a reflective mask blank, and a method of manufacturing a reflective mask using such a reflective mask blank.

Further, according to this invention, by manufacturing a semiconductor device using the reflective mask described above, it is possible to eliminate the occurrence of a defect due to peeling-off of the multilayer reflective film and thus to provide a semiconductor device manufacturing method that can obtain a high-quality semiconductor device.

Further, according to this invention, it is possible to provide a reflective mask blank that, in addition to the above-described effects, can prevent damage to an electrostatic chuck of an EUV exposure apparatus during mask use and further can prevent degradation of pattern accuracy due to sensitization of an unnecessary resist on a transfer target substrate by reflected light due to a conductive film, a method of manufacturing such a reflective mask blank, and a method of manufacturing a reflective mask using such a reflective mask blank.

Further, since it is prevented that an unnecessary resist on a transfer target substrate is sensitized by reflected light due to a conductive film, it is possible to obtain a high-quality semiconductor device that is free of degradation of pattern accuracy.

MODE FOR CARRYING OUT THE INVENTION

Hereinbelow, embodiments of this invention will be described in detail.

First Embodiment

Figure 1:
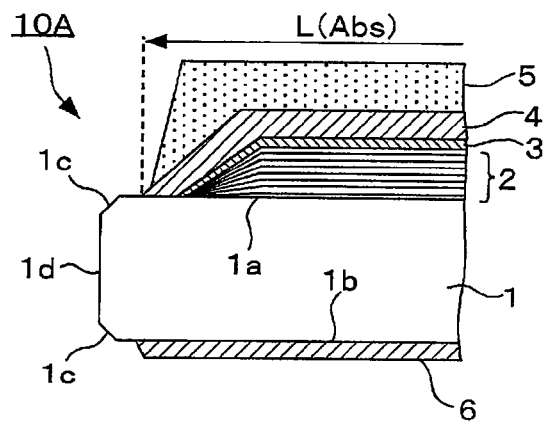
FIG. 1 is a cross-sectional view showing a structure of a reflective mask blank of a first embodiment according to this invention.

FIG. 1 is a cross-sectional view showing a structure of a reflective mask blank of a first embodiment according to this invention.

As shown in FIG. 1, a reflective mask blank 10A of this embodiment has a structure in which a multilayer reflective film 2 configured to reflect EUV light as exposure light, a protective film 3 for protecting the multilayer reflective film 2, an absorber film 4 configured to absorb the EUV light, and a resist film 5 are formed in this order on a main surface 1a, one of main surfaces, of a substrate 1 and a conductive film 6 is formed on the other main surface 1b (hereinafter also referred to as a "back surface") of the substrate 1.

For EUV exposure, in order to prevent distortion of a pattern due to heat in exposure, use is preferably made of, as the substrate 1, a substrate material having a low thermal expansion coefficient in a range of $0\pm1.0\times10^{-7}/°$ C., more preferably in a range of $0\pm0.3\times10^{-7}/°$ C. As the material having the low thermal expansion coefficient in this range, it is possible to use, for example, a glass substrate such as a $SiO_2$—$TiO_2$-based glass (binary system ($SiO_2$—$TiO_2$) or ternary system ($SiO_2$—$TiO_2$—$SnO_2$ or the like) or, for example, a $SiO_2$—$Al_2O_3$—$Li_2O$-based crystallized glass.

The glass substrate described above is preferably used as the substrate 1 and its main surface on the side where a transfer pattern is to be formed is surface-machined to a high flatness in terms of ensuring at least pattern transfer accuracy and pattern position accuracy. For EUV exposure, the flatness is preferably 0.1 μm or less and particularly preferably 0.05 μm or less in a 142 mm×142 mm region of the main surface, on the side where the transfer pattern is to be formed, of the glass substrate. A main surface, on the side opposite to the side where the transfer pattern is to be formed, of the glass substrate is a surface that is electrostatically chucked when it is set in an exposure apparatus. The flatness thereof is 1 μm or less, preferably 0.5 μm or less in a 142 mm×142 mm region. The flatness referred to herein is a value indicating a warp (deformation amount) of a surface given by TIR (Total Indicated Reading) and, assuming that a plane determined by the method of least squares on the basis of a surface of a glass substrate is given as a focal plane, the flatness is an absolute value of a height difference between the highest position of the surface of the glass substrate located above the focal plane and the lowest position of the surface of the glass substrate located below the focal plane.

As described above, the glass substrate having the low thermal expansion coefficient, such as the $SiO_2$—$TiO_2$-based glass, is used as the substrate 1. However, with such a glass substrate, it may be difficult to achieve high smoothness such as a surface roughness of 0.1 nm or less in RMS by precision polishing. Therefore, it is preferable to form an underlayer on the surface of the glass substrate for the purpose of reducing the surface roughness of the glass substrate or reducing defects of the surface of the glass substrate. As a material of such an underlayer, it does not need to have transparency for exposure light and it is preferable to select a material that can obtain high smoothness when a surface of the underlayer is precision-polished and that is excellent in defect quality. For example, Si or a silicon compound containing Si (e.g. $SiO_2$, SiON, or the like) is preferably used because high smoothness is obtained when precision-polished and the defect quality is excellent. Si is particularly preferable. It is desirable that the surface of the underlayer be precision-polished to a root mean square roughness (RMS) of 0.15 nm or less, particularly preferably 0.1 nm or less.

The multilayer reflective film 2 is a multilayer film in which low refractive index layers and high refractive index layers are alternately laminated. Generally, use is made of a multilayer film in which thin films of a heavy element or its compound and thin films of a light element or its compound are alternately laminated by about 40 to 60 cycles. For example, as a multilayer reflective film for EUV light having a wavelength of 13 to 14 nm, use is preferably made of a Mo/Si cycle multilayer film in which Mo films and Si films are alternately laminated by about 40 cycles. Other than this, as a multilayer reflective film for use in a region of EUV light, there is a Ru/Si cycle multilayer film, a Mo/Be cycle multilayer film, a Mo compound/Si compound cycle multilayer film, a Si/Nb cycle multilayer film, a Si/Mo/Ru cycle multilayer film, a Si/Mo/Ru/Mo cycle multilayer film, a Si/Ru/Mo/Ru cycle multilayer film, or the like. The material may be properly selected according to an exposure wavelength.

The protective film 3 is provided for protecting the multilayer reflective film from dry etching and wet cleaning in a reflective mask manufacturing process. As a material of the protective film 3, use is made of, for example, ruthenium (Ru) alone, a ruthenium compound containing Ru and one or more elements from Nb, Zr, Y, B, Ti, La, and Mo, a silicon compound containing silicon (Si) and one or more elements from Ru, Rh, Cr, and B, or a material such as Si, Zr, Nb, La, or B. With the use of, among them, particularly the material containing Ru, the reflectance property of the multilayer reflective film becomes better.

The absorber film 4 has the function of absorbing EUV light as exposure light and use is preferably made of, for example, tantalum (Ta) alone or a material composed mainly of Ta. The material composed mainly of Ta is usually an alloy of Ta. The crystalline state of such an absorber film preferably has an amorphous or microcrystalline structure in terms of smoothness and flatness. As the material composed mainly of Ta, it is possible to use, for example, a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, or the like. By adding B, Si, Ge, or the like to Ta, an amorphous structure can be easily obtained to improve the smoothness. Further, by adding N or O to Ta, the resistance to oxidation is improved and therefore the temporal stability can be improved.

The conductive film 6 is provided for facilitating electrostatic chucking of a reflective mask. As a material of the conductive film 6, it preferably has a sheet resistance value of 100 Ω/square or less and it is possible to use, for example, a material (CrN) containing Cr and N or a material containing Ta. In terms of improving the wear resistance and chemical resistance of the conductive film during electrostatic chucking, the material containing Ta is particularly preferable. Although details will be described later, when the material containing Ta is used as the conductive film 6, it is preferable that at least heat energy or light energy be applied in advance to the glass substrate, thereby using the glass substrate from which hydrogen contained therein has been eliminated.

In the reflective mask blank 10A of this embodiment, assuming that a distance from the center of the substrate 1 to an outer peripheral end of the multilayer reflective film 2 is L(ML), that a distance from the center of the substrate 1 to an outer peripheral end of the protective film 3 is L(Cap), that a distance from the center of the substrate 1 to an outer peripheral end of the absorber film 4 is L(Abs), and that a distance from the center of the substrate 1 to an outer peripheral end of the resist film 5 is L(Res), the multilayer reflective film 2, the protective film 3, the absorber film 4, and the resist film 5 are respectively formed so that a relationship of L(Abs)>L(Res)>L(Cap)≥L(ML) is satisfied and that the outer peripheral end of the resist film 5 is located inward of an outer peripheral end of the substrate 1.

FIG. 1 shows by way of example a case where L(Cap)>L(ML). In FIG. 1, while L(Abs) is specifically shown, L(ML), L(Cap), and L(Res) also have the same meanings as described above. In the case of a rectangular (e.g. square) substrate, the center of the substrate 1 represents a position of its center of gravity (position of a point, on the main surface 1a of the substrate 1, corresponding to the position of the center of gravity). The outer peripheral end of the substrate 1 represents a boundary line between the main surface 1a and a chamfered surface 1c (interposed between the main surface 1a and a side wall surface 1d of the substrate 1) of the substrate 1.

As is clear from FIG. 1, in this embodiment, the protective film 3 is formed so as to cover a forming region of the multilayer reflective film 2 formed on the main surface 1a, one of the main surfaces, of the substrate 1, the absorber film 4 is formed so as to cover a forming region of the protective film 3, and these films satisfy the relationship of L(Abs)>L(Res)>L(Cap)≥L(ML) with respect to the resist film 5 formed so as to be located inward of the outer peripheral end of the substrate 1.

The reason that the outer peripheral end of the resist film 5 is located inward of the outer peripheral end of the substrate 1 is to suppress the occurrence of dust due to peeling-off of the resist film at a substrate peripheral edge portion. In this embodiment, the outer peripheral end of the absorber film 4 is located inward of the outer peripheral end of the substrate 1.

FIG. 1 is a cross-sectional view showing a structure of a reflective mask 20A obtained using the reflective mask blank 10A of the first embodiment shown in FIG. 1.

When manufacturing a reflective mask using the reflective mask blank 10A, first, the resist film 5 is subjected to desired electron beam writing and to development, thereby forming a resist pattern. Then, using the resist pattern as a mask, the absorber film 4 is dry-etched to form an absorber film pattern 4a. Consequently, the reflective mask 20A having a structure in which the absorber film pattern 4a is formed over the multilayer reflective film 2 and its protective film 3 is completed.

Figure 2:
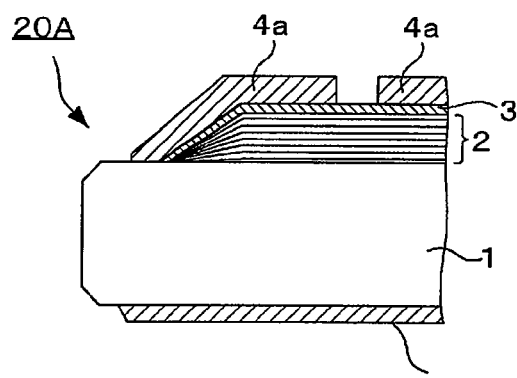
FIG. 2 is a cross-sectional view showing a structure of a reflective mask obtained using the reflective mask blank of the first embodiment.

As is also clear from FIG. 2, when the reflective mask 20A is manufactured using the reflective mask blank 10A of this embodiment satisfying the above-described predetermined relationship regarding the forming regions of the respective films forming the reflective mask blank, since the multilayer reflective film is not exposed at the substrate peripheral edge portion where the absorber film pattern is not formed, it is possible to prevent peeling-off of the multilayer reflective film due to cleaning or the like in the mask manufacturing process or during mask use. Therefore, it is also possible to eliminate the occurrence of a defect due to peeling-off of the multilayer reflective film.

Next, a method of manufacturing the reflective mask blank of this embodiment described above will be described.

[Substrate Producing Process]

There is prepared a glass substrate that has been cleaned after its main surfaces were mirror-polished to a predetermined smoothness and flatness. A glass material for use is as described earlier.

Then, before proceeding to a film forming process, a treatment may be carried out in advance to desorb hydrogen contained in the glass substrate. When a material containing Ta is used as the conductive film 6 formed on the back surface of the substrate 1, it is preferable that at least heat energy or light energy be applied in advance to the glass substrate, thereby using the glass substrate from which hydrogen contained therein has been eliminated.

By applying a heat treatment or a light irradiation treatment to the glass substrate, OH groups, hydrogen, water, and the like captured in a surface layer of the glass substrate or inside the glass substrate can be forcibly expelled. By forming the conductive film 6 containing tantalum on the glass substrate having been subjected to the heat treatment or the light irradiation treatment, it is possible to suppress capture of hydrogen into the conductive film 6 containing tantalum and thus to suppress a temporal increase in the compressive stress of the conductive film 6.

The heat treatment applied to the glass substrate is preferably a treatment of heating the glass substrate to 150° C. or more. By a heat treatment at less than 150° C., the temperature is insufficient so that the effect of expelling hydrogen in the glass substrate to the outside of the glass substrate is not sufficiently obtained. If the heat treatment is at 200° C. or more, a greater effect is obtained. The heat treatment is more preferably at 300° C. or more, further preferably at 400° C. or more, and particularly preferably at 500° C. or more so that a sufficient effect of expelling hydrogen to the outside of the glass substrate is obtained even if the heating time is shortened. The heat treatment applied to the glass substrate should be at less than a softening point temperature of the material of the glass substrate. This is because if it is at the softening point temperature or more, the glass substrate is softened and deformed. The softening point of a glass material is such that, for example, a $SiO_2$—$TiO_2$-based glass has a softening point of 1490° C., while a synthetic quartz glass has a softening point of 1600° C. In order to reliably avoid deformation of the glass substrate due to softening, the heat treatment is preferably carried out at a temperature somewhat lower than the softening point of the glass material. Specifically, the temperature of the heat treatment to the glass such as the $SiO_2$—$TiO_2$-based glass or the synthetic quartz glass is preferably 1200° C. or less, more preferably 1000° C. or less, and further preferably 800° C. or less. The treatment time of the heat treatment is, although depending on a heating temperature, preferably at least 5 minutes or more, more preferably 10 minutes or more, and further preferably 30 minutes or more.

The heat treatment is preferably carried out in a state where a gas from which hydrogen has been expelled as much as possible is present around the glass substrate. In air, the abundance of hydrogen itself is low, but water vapor is present in abundance. Even in air in a clean room, while the humidity is controlled, the abundance of water vapor is relatively large. By applying the heat treatment to the glass substrate in dry air, it is possible to suppress invasion of hydrogen due to water vapor into the glass substrate. Further, it is more preferable to apply the heat treatment to the glass substrate in a gas free of hydrogen and water vapor (inert gas such as nitrogen, rare gas, or the like). The heat treatment of the glass substrate can also be carried out in a vacuum.

Next, the light irradiation treatment applied to the glass substrate will be described.

The light irradiation treatment is preferably carried out in a state where a gas from which hydrogen has been expelled as much as possible is present around the glass substrate. In air, the abundance of hydrogen itself is low, but water vapor is present in abundance. Even in air in a clean room, while the humidity is controlled, the abundance of water vapor is relatively large. By applying the heat treatment to the glass substrate in dry air, it is possible to suppress invasion of hydrogen due to water vapor into the glass substrate. Further, it is more preferable to apply the light irradiation treatment to the glass substrate in a gas free of hydrogen and water vapor (inert gas such as nitrogen, rare gas, or the like). The light irradiation treatment can be carried out in an atmospheric pressure gas or in a vacuum. In order to reliably reduce OH groups, hydrogen, water, and the like captured in a surface layer of the glass substrate and inside the glass substrate, it is preferable to provide a certain or higher degree of vacuum around the glass substrate to be subjected to the light irradiation treatment. More preferably, the degree of vacuum is a medium vacuum (0.1 Pa to 100 Pa).

Light for use in the light irradiation treatment is preferably light having a wavelength of 1.3 μm or more. For example, light emitted from a halogen heater is light having a wavelength of 1.3 μm or more, and therefore, specifically, the light irradiation treatment is preferably a treatment of irradiating the light emitted from the halogen heater to the glass substrate.

The light irradiation time in the light irradiation treatment is, although depending on a wavelength of a light source in use, preferably 1 minute or more, more preferably 5 minutes or more, and desirably 10 minutes or more in the case of, for example, light having a wavelength of 1.3 μm or more (halogen heater).

The glass substrate is produced in the manner described above.

[Multilayer Reflective Film Forming Process]

Figure 7:
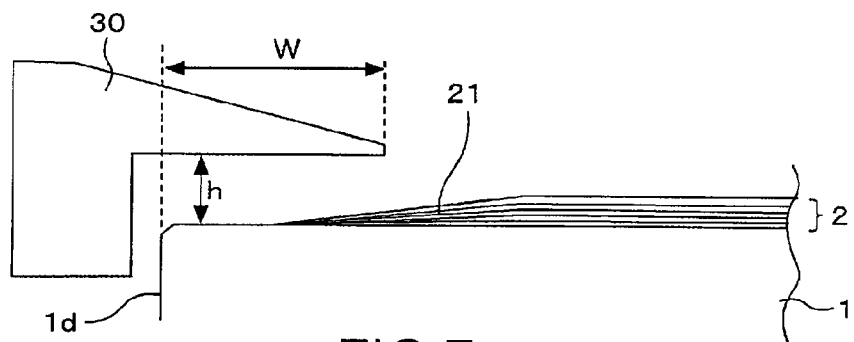
FIG. 7 is a structural diagram showing a film forming method provided with a shielding member.

As described earlier, for example, as the multilayer reflective film 2 for EUV light having a wavelength of 13 to 14 nm, use is preferably made of a Mo/Si cycle multilayer film in which Mo films and Si films are alternately laminated by about 40 cycles. Usually, the multilayer reflective film 2 is formed by ion-beam sputtering, magnetron sputtering, or the like. In this embodiment, since the outer peripheral end of the multilayer reflective film 12 should be adjusted to the predetermined relationship with the outer peripheral ends of the other films, it is possible to apply a film forming method provided with a shielding member 30 as shown in FIG. 7. By providing the shielding member 30 so as to be spaced apart from the peripheral edge portion of the substrate 1, sputtered particles are prevented from being deposited on the peripheral edge portion of the substrate 1. Further, by providing the shielding member 30, a film thickness gradient region 21 can be formed in an outer peripheral region of the multilayer reflective film. By adjusting a distance h between the main surface of the substrate 1 and the shielding member 30, a shielding length W by the shielding member 30, and the incident angle of sputtered particles with respect to the normal of the main surface of the substrate 1, the distance L(ML) from the center of the substrate 1 to the outer peripheral end of the multilayer reflective film 2 and the thickness and inclination angle in the film thickness gradient region 21 can be controlled.

[Protective Film Forming Process]

As the protective film 3, use is preferably made of, for example, a material containing Ru, or the like. Usually, the protective film 3 is also formed by ion-beam sputtering, magnetron sputtering, or the like. Since the outer peripheral end of the protective film 3 should also be adjusted to the predetermined relationship with the outer peripheral ends of the other films, the film forming method provided with the shielding member 30 as shown in FIG. 7 can be applied to the formation of the protective film 3.

The thickness of the protective film 3 is not particularly limited. However, the thickness of the protective film 3 is properly set so as not to significantly affect the reflectance of the multilayer reflective film 2 and to be capable of protecting the multilayer reflective film 2 from dry etching and subsequent wet cleaning and is in a range of, for example, 1 to 5 nm.

[Absorber Film Forming Process]

Figure 8:
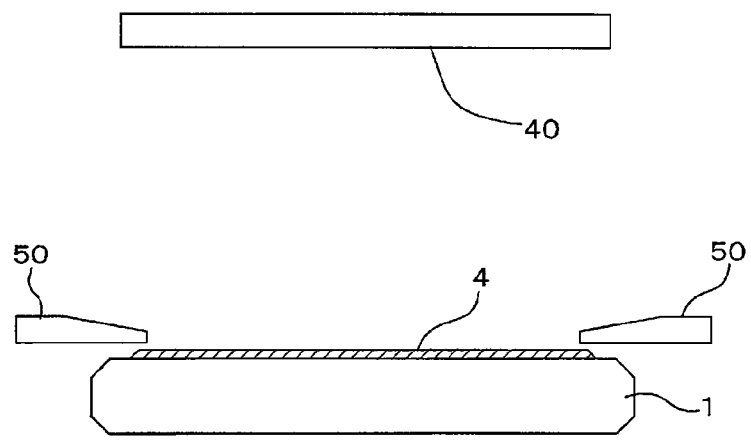
FIG. 8 is a structural diagram showing a film forming method provided with a shielding member.

As described earlier, as the absorber film 4, use is preferably made of, for example, tantalum (Ta) alone or a material composed mainly of Ta. Usually, the absorber film 4 is formed by magnetron sputtering or the like. In this embodiment, since the outer peripheral end of the absorber film 4 should also be adjusted to the predetermined relationship with the outer peripheral ends of the other films, a film forming method provided with a shielding member 50 as shown in FIG. 8, for example, can be applied to the formation of the absorber film 4. By providing the shielding member 50 so as to be spaced apart from the peripheral edge portion of the substrate 1, sputtered particles from a sputtering target 40 are prevented from being deposited on the peripheral edge portion of the substrate 1 so that the absorber film 4 is not formed in the outer peripheral region of the substrate 1.

The thickness of the absorber film 4 is satisfactory if it can sufficiently absorb EUV light as exposure light and, although it differs depending on an absorption coefficient of an absorber material for use, it is usually in a range of about 30 to 100 nm.

[Conductive Film Forming Process]

As described earlier, as the conductive film 6 provided on the back surface of the substrate 1, it is possible to use, for example, a material (CrN) containing Cr and N or a material containing Ta. In terms of improving the wear resistance and chemical resistance of the conductive film during electrostatic chucking, the material containing Ta is particularly preferably used. Usually, the conductive film 6 is formed by ion-beam sputtering, magnetron sputtering, or the like. When the material containing Ta is used as the conductive film 6 as described above, it is preferable that at least heat energy or light energy be applied in advance to the glass substrate, thereby using the glass substrate from which hydrogen contained therein has been eliminated.

The material containing Ta is preferably a material containing tantalum and substantially free of hydrogen, which can improve the wear resistance and chemical resistance of the conductive film 6 during electrostatic chucking.

Tantalum has a property that it is weakened when it captures hydrogen. Therefore, it is desirable to suppress the content of hydrogen even in a state immediately after the formation of the conductive film 6 made of the material containing tantalum. Accordingly, it is desirable to select the material containing tantalum and substantially free of hydrogen. Herein, "substantially free of hydrogen" means that the hydrogen content in the conductive film 6 is at least 5 at % or less. The range of the hydrogen content in the conductive film 6 is preferably 3 at % or less and more preferably a detection lower limit or less.

As the material that forms the conductive film 6 and that contains tantalum and is substantially free of hydrogen, there can be cited, for example, a tantalum metal, a material containing tantalum and one or more elements selected from nitrogen, oxygen, boron, and carbon and substantially free of hydrogen, or the like. Specifically, the conductive film 6 can be a thin film of one kind of a material or a plurality of thin films of two or more kinds of materials selected from Ta, TaN, TaO, TaON, TaB, TaBN, TaBO, TaBON, TaSi, TaSiN, TaSiO, and TaSiON. Further, in order to improve the wear resistance and to suppress the occurrence of particles, the conductive film 6 preferably has an amorphous (amorphous) structure with high surface smoothness. The material described above can contain a metal other than tantalum.

The conductive film 6 can contain a material containing tantalum and nitrogen and substantially free of hydrogen. By adding nitrogen to tantalum, it is possible to suppress oxidation of tantalum in the conductive film 6.

In terms of the wear resistance and chemical resistance, it is preferable to use TaBN and/or TaN and more preferable to use TaBN/$Ta_2O_5$ or TaN/$Ta_2O_5$.

When the conductive film 6 is a TaB thin film, the composition ratio is preferably such that the content of B is 5 to 25 at % with the balance Ta. When the conductive film 6 is TaBN, the composition ratio is preferably such that the content of B is 5 to 25 at % and the content of N is 5 to 40 at %, with the balance Ta. When the conductive film 6 is TaN, the composition ratio is preferably such that the content of N is 5 to 40 at % with the balance Ta. When the conductive film 6 is TaO, the composition ratio is preferably such that the content of O is 1 to 20 at % with the balance Ta.

The thickness of the conductive film 6 is not particularly limited and is properly set, which is in a range of, for example, 10 to 300 nm.

The conductive film 6 may first be formed on the substrate 1 before forming the multilayer reflective film 2.

[Resist Film Forming Process]

Usually, the resist film 5 is spin-coated (spin-coated) using a spin coating apparatus. In this embodiment, in order to suppress the occurrence of dust due to peeling-off of the resist film at the substrate peripheral edge portion, the outer peripheral end of the resist film 5 is located inward of the outer peripheral end of of the substrate 1. In order to form the resist film 5 in this manner, there is given a method in which a resist film is formed on the entire blank main surface by usual spin coating and then the resist film formed at a blank peripheral edge portion is removed.

In this case, as a method of removing the unnecessary resist film at the blank peripheral edge portion, it is possible to use, for example, a method in which a mask blank main surface entirely formed with a resist film is covered with a cover member and a solvent adapted to dissolve the resist film is supplied from above the cover member so that the solvent is supplied to a predetermined portion via a solvent flow path provided at a peripheral portion of the cover member while adjusting a solvent supply amount and/or a solvent supply apparatus so that the resist film remains in a region excluding a mask blank peripheral edge portion and is removed at the mask blank peripheral edge portion, thereby removing the unnecessary resist film by the solvent (see Japanese Patent (JP-B) No. 3607903). Alternatively, use may be made of a removal apparatus equipped with a head (specifically, a head formed in a]-shape in section so as to surround upper and lower main surface peripheral edge portions and an end face portion of a substrate) including a supply path for supplying a resist peeling liquid to an unnecessary resist region and a discharge path for discharging the peeling liquid in which a resist in the unnecessary resist region is dissolved (see, e.g. JP-A-2004-335845). Alternatively, it is possible to use a method in which a mask blank peripheral edge portion is sealed in advance so as to prevent a resist film from being formed therein, and then a resist film is formed by usual spin coating.

A method of manufacturing a reflective mask (see FIG. 2) using the reflective mask blank (see FIG. 1) of this embodiment thus manufactured is as described earlier.

Second Embodiment

Figure 3:
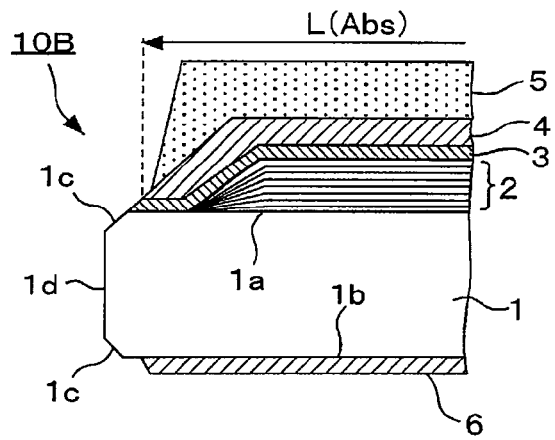
FIG. 3 is a cross-sectional view showing a structure of a reflective mask blank of a second embodiment according to this invention.

FIG. 3 is a cross-sectional view showing a structure of a reflective mask blank of a second embodiment according to this invention.

In the reflective mask blank 10B of this embodiment, assuming that a distance from the center of the substrate 1 to an outer peripheral end of the multilayer reflective film 2 is L(ML), that a distance from the center of the substrate 1 to an outer peripheral end of the protective film 3 is L(Cap), that a distance from the center of the substrate 1 to an outer peripheral end of the absorber film 4 is L(Abs), and that a distance from the center of the substrate 1 to an outer peripheral end of the resist film 5 is L(Res), the multilayer reflective film 2, the protective film 3, the absorber film 4, and the resist film 5 are respectively formed so that a relationship of L(Abs)≥L(Cap)>L(Res)>L(ML) is satisfied and that the outer peripheral end of the resist film 5 is located inward of an outer peripheral end of the substrate 1.

FIG. 3 shows by way of example a case where L(Abs) and L(Cap) are approximately equal to each other.

As is clear from FIG. 3, in this embodiment, the protective film 3 is formed so as to cover a forming region of the multilayer reflective film 2 formed on a main surface 1a, one of main surfaces, of the substrate 1 and to almost entirely cover the main surface 1a, the absorber film 4 is formed so as to cover approximately the same region as a forming region of the protective film 3, and these films satisfy the relationship of L(Abs)≥L(Cap)>L(Res)>L(ML) with respect to the resist film 5 formed so as to be located inward of the outer peripheral end of the substrate 1.

Figure 4:
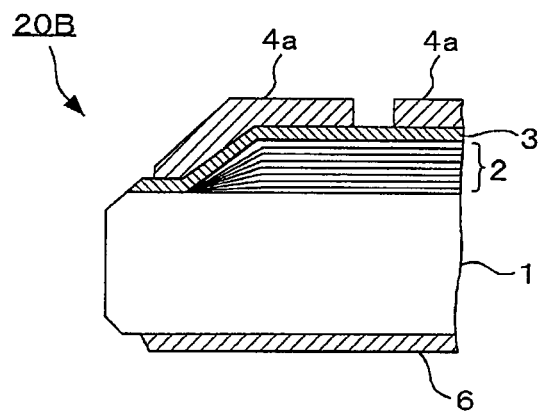
FIG. 4 is a cross-sectional view showing a structure of a reflective mask obtained using the reflective mask blank of the second embodiment.

FIG. 4 is a cross-sectional view showing a structure of a reflective mask 20B obtained using the reflective mask blank 10B of the second embodiment shown in FIG. 3.

Like the first embodiment described above, when manufacturing a reflective mask using the reflective mask blank 10B, first, the resist film 5 is subjected to desired electron beam writing and to development, thereby forming a resist pattern. Then, using the resist pattern as a mask, the absorber film 4 is dry-etched to form an absorber film pattern 4a. Consequently, the reflective mask 20B having a structure in which the absorber film pattern 4a is formed over the multilayer reflective film 2 and its protective film 3 is completed.

As is also clear from FIG. 4, in this embodiment also, when the reflective mask 20B is manufactured using the reflective mask blank 10B of this embodiment satisfying the above-described predetermined relationship regarding the forming regions of the respective films forming the reflective mask blank, since the multilayer reflective film is not exposed at the substrate peripheral edge portion where the absorber film pattern is not formed, it is possible to prevent peeling-off of the multilayer reflective film due to cleaning or the like in the mask manufacturing process or during mask use. Further-more, it is also possible to eliminate the occurrence of a defect due to peeling-off of the multilayer reflective film.

In this embodiment, the protective film 3 is exposed at the substrate peripheral edge portion of the reflective mask 20B. Therefore, unless the protective film 3 has sufficient resistance to cleaning or the like in the mask manufacturing process or during mask use, the protective film 3 may be damaged due to such cleaning or the like so that there is a possibility that the multilayer reflective film 2 at the peripheral edge portion may be exposed some time later, leading to peeling-off of the multilayer reflective film 2.

As described earlier, as a material of the protective film 3, use is made of, for example, ruthenium (Ru) alone, a ruthenium compound, a silicon compound, or the like. In this embodiment, however, as the protective film 3, it is preferable to use a material composed of an alloy of at least two kinds of metals including ruthenium (Ru), wherein the alloy is a complete solid solution. By the use of the material composed of an alloy of at least two kinds of metals including ruthenium (Ru), the alloy being a complete solid solution, the loss of the protective film due to, for example, dry etching with a chlorine-based gas used for dry-etching a Ta-based material or due to chemical cleaning or the like in the mask manufacturing process or during mask use becomes very small. In this embodiment, since the loss of the protective film exposed at the substrate peripheral edge portion where the absorber film pattern is not formed is suppressed, it is possible to prevent exposure and peeling-off of the underlying multilayer reflective film.

The complete solid solution described above is an alloy in which constituent metals are melted together at any concentrations in either a liquid-phase state or a solid-phase state. Since an alloy being a complete solid solution is very stable, it is hardly chlorinated by dry etching using a chlorine-based gas.

As the alloy being the complete solid solution, there can be cited, for example, an alloy composed of ruthenium (Ru) and cobalt (Co), an alloy composed of ruthenium (Ru) and rhenium (Re), an alloy composed of nickel (Ni) and copper (Cu), an alloy composed of gold (Au) and silver (Ag), an alloy composed of silver (Ag) and tin (Sn), an alloy composed of silver (Ag) and copper (Cu), an alloy composed of germanium (Ge) and silicon (Si), or the like. In this embodiment, an alloy containing at least ruthenium is preferable.

These alloys may form the protective film 3 alone or two or more kinds of alloys may be used together to form the protective film 3.

An element such as oxygen, nitrogen, hydrogen, or carbon may be contained in an alloy being a complete solid solution and forming the protective film 3 in a range in which the protective film 3 is hardly chlorinated by dry etching using a chlorine-based gas and the effect of suppressing the loss or disappearance of the protective film 3 due to wet cleaning is exhibited.

An oxide, a nitride, a hydride, a carbide, an oxynitride, an oxycarbide, a carboxynitride, or the like of an alloy being a complete solid solution may be formed at an outermost surface of the protective film 3 in a range in which the protective film 3 is hardly chlorinated by dry etching using a chlorine-based gas and the effect of suppressing the loss or disappearance of the protective film 3 due to wet cleaning is exhibited.

Since the protective film 3 usually remains in the reflective mask as its constituent layer, its absorption of EUV light is preferably low (in the state where the protective film 3 is formed, the reflectance of the multilayer reflective film 2 is usually 63% or more (usually less than 73%)). Also from such a viewpoint, the protective film 3 is preferably an alloy composed of ruthenium (Ru) and cobalt (Co) or an alloy composed of ruthenium (Ru) and rhenium (Re).

In terms of high reflectance (reflectance 63% or more) for EUV light, in the alloy composed of ruthenium (Ru) and cobalt (Co) or the alloy composed of ruthenium (Ru) and rhenium (Re), the content of Ru is preferably 75 at % or more and 99.5 at % or less, more preferably 90 at % or more and 99.5 at % or less, and particularly preferably 95 at % or more and 99.5 at % or less. This atomic composition can be measured by Auger electron spectroscopy.

Also for such a protective film 3 made of the alloy being the complete solid solution, its forming method and thickness are the same as in the first embodiment.

Such an alloy material being the complete solid solution with which the loss of the protective film due to dry etching with a chlorine-based gas or due to chemical cleaning or the like in the mask manufacturing process or during mask use becomes very small is, of course, preferable also in the first embodiment (the protective film 3 is not exposed at the substrate peripheral edge portion).

Third Embodiment

Figure 5:
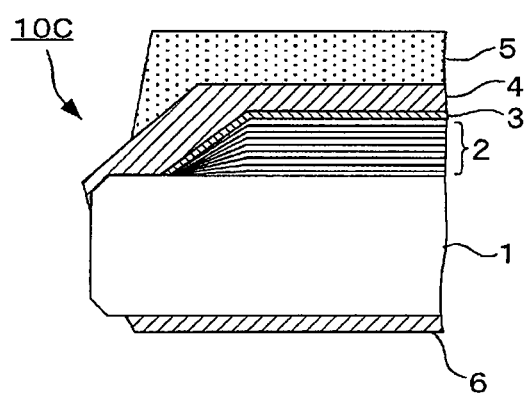
FIG. 5 is a cross-sectional view showing a structure of a reflective mask blank of a third embodiment according to this invention.

FIG. 5 is a cross-sectional view showing a structure of a reflective mask blank of a third embodiment according to this invention.

A reflective mask blank 10C of this embodiment is a modification of the reflective mask blank 10A of the first embodiment, wherein an absorber film 4 is formed to extend over part of an end face (chamfered surfaces 1c and a side wall surface 1d) of the substrate 1. Such an absorber film 4 can be formed by carrying out the film formation without providing the shielding member 50 (FIG. 8) described earlier.

Fourth Embodiment

Figure 6:
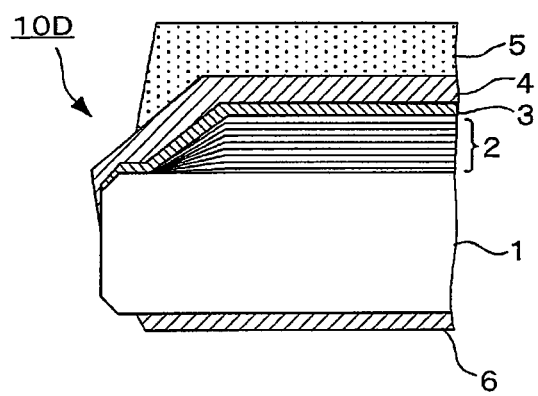
FIG. 6 is a cross-sectional view showing a structure of a reflective mask blank of a fourth embodiment according to this invention.

FIG. 6 is a cross-sectional view showing a structure of a reflective mask blank of a fourth embodiment according to this invention.

A reflective mask blank 10D of this embodiment is a modification of the reflective mask blank 10B of the second embodiment, wherein a protective film 3 and an absorber film 4 are each formed to extend over part of an end face (chamfered surfaces 1c and a side wall surface 1d) of the substrate 1. Such a protective film 3 and such an absorber film 4 can each be formed by carrying out the film formation without providing the shielding member 30 or 50 (FIG. 7, FIG. 8) described earlier.

Also in a reflective mask obtained using the reflective mask blank 10C of the third embodiment described above or the reflective mask blank 10D of the fourth embodiment described above, since the multilayer reflective film is not exposed at the substrate peripheral edge portion where an absorber film pattern is not formed, it is possible to prevent peeling-off of the multilayer reflective film due to cleaning or the like in the mask manufacturing process or during mask use and further to eliminate the occurrence of a defect due to peeling-off of the multilayer reflective film.

Fifth Embodiment

Figure 11:
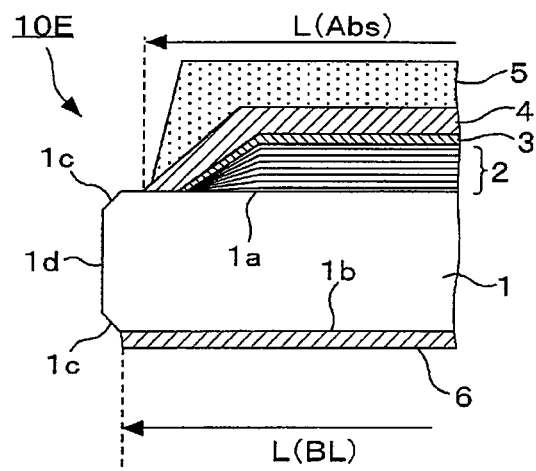
FIG. 11 is a cross-sectional view showing a structure of a reflective mask blank of a fifth embodiment according to this invention.

FIG. 11 is a cross-sectional view showing a structure of a reflective mask blank of a fifth embodiment according to this invention.

A reflective mask blank 10E of this embodiment is a modification of the reflective mask blank 10A of the first embodiment and is a reflective mask blank, wherein a conductive film 6 is formed on the substrate 1 on the side opposite to the side where the multilayer reflective film 2 is formed and, assuming that a distance from the center of the substrate 1 to an outer peripheral end of the conductive film 6 is L(BL), a relationship of L(BL)>L(Res) is satisfied.

In this embodiment, since the outer peripheral end of the conductive film 6 should also be adjusted to the predetermined relationship (L(BL)>L(Res)) with the outer peripheral end of the resist film 5, the film forming method provided with the shielding member 50 as shown in FIG. 8, for example, can be applied to the formation of the conductive film 6. By providing the shielding member 50 so as to be spaced apart from a peripheral edge portion of the substrate 1, sputtered particles from the sputtering target 40 are prevented from being deposited on the peripheral edge portion of the substrate 1 so that the conductive film 6 is not formed in the outer peripheral region of the substrate 1.

Figure 12:
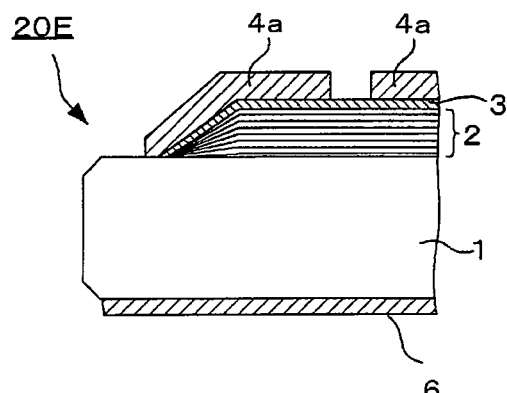
FIG. 12 is a cross-sectional view showing a structure of a reflective mask obtained using the reflective mask blank of the fifth embodiment.

FIG. 12 is a cross-sectional view showing a structure of a reflective mask 20E obtained using the reflective mask blank 10E of the fifth embodiment shown in FIG. 11.

When manufacturing a reflective mask using the reflective mask blank 10E, first, the resist film 5 is subjected to desired electron beam writing and to development, thereby forming a resist pattern. Then, using the resist pattern as a mask, the absorber film 4 is dry-etched to form an absorber film pattern 4a. Consequently, the reflective mask 20E having a structure in which the absorber film pattern 4a is formed over the multilayer reflective film 2 and its protective film 3 is obtained.

As is also clear from FIG. 12, in the case where the reflective mask 20E is manufactured using the reflective mask blank 10E of this embodiment satisfying the above-described predetermined relationship regarding the forming regions of the respective films forming the reflective mask blank, when manufacturing a semiconductor device by holding the back surface of the reflective mask 20E using an electrostatic chuck and transferring a pattern to a transfer target substrate by an EUV exposure apparatus, even if light in the vacuum ultraviolet region, other than EUV light, is incident on the substrate peripheral edge portion, where the absorber film pattern 4a of the reflective mask 20E is not formed and the substrate 1 is exposed, and enters the substrate, since the conductive film 6 is formed on the back surface of the substrate, the light in the vacuum ultraviolet region (wavelength 190 to 400 nm) is not irradiated to the electrostatic chuck of the EUV exposure apparatus. Therefore, it is possible to prevent damage to the electrostatic chuck due to such light.

A reflection reducing layer configured to reduce reflection of light having a wavelength in the vacuum ultraviolet region can be provided on a surface, on the glass substrate side, of the conductive film 6. In this case, when manufacturing a semiconductor device by holding the back surface of the reflective mask 20E using an electrostatic chuck and transferring a pattern to a transfer target substrate by an EUV exposure apparatus, even if light in the vacuum ultraviolet region, other than EUV light, is incident on the substrate peripheral edge portion, where the absorber film pattern 4a of the reflective mask 20E is not formed and the substrate 1 is exposed, and enters the substrate, since the reflection reducing layer configured to reduce reflection of light having a wavelength in the vacuum ultraviolet region is formed on the back surface of the substrate, there does not arise a problem that an unnecessary resist on the transfer target substrate is sensitized to cause degradation of pattern accuracy. As the reflection reducing layer, a material is selected that, for example, causes reflection of light in the vacuum ultraviolet region to be 15% or less.

As the material of the reflection reducing layer, it is possible to use CrO, CrON, TaO, TaON, TaBO, TaBON, or the like. When the reflection reducing layer is a metal oxide (CrO, TaO, TaBO, or the like), the content of oxygen (O) is preferably set to 10 at % to 90 at %. When the reflection reducing layer is a metal oxynitride (CrON, TaON, TaBON, or the like), the total content of oxygen (O) and nitrogen (N) is preferably set to 10 at % to 90 at %.

As the conductive film 6 formed with the reflection reducing layer on its surface on the glass substrate side, it may have a laminated structure of, from the glass substrate side, a reflection reducing layer and a conductive layer for facilitating vacuum chucking.

Also in the reflective mask 20E obtained using the reflective mask blank 10E of the fifth embodiment described above, since the multilayer reflective film is not exposed at the substrate peripheral edge portion where the absorber film pattern is not formed, it is possible to prevent peeling-off of the multilayer reflective film due to cleaning or the like in the mask manufacturing process or during mask use and further to eliminate the occurrence of a defect due to peeling-off of the multilayer reflective film.

Sixth Embodiment

Figure 13:
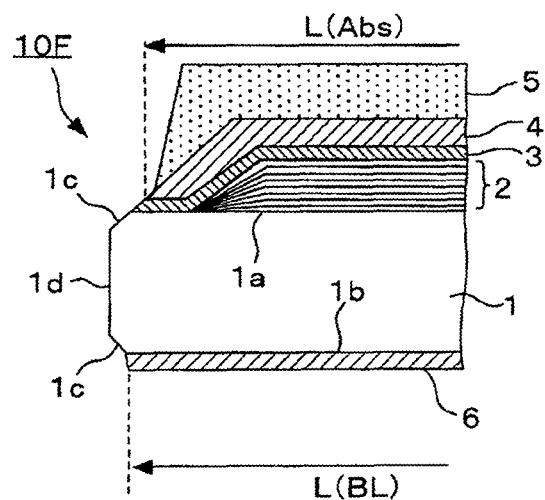
FIG. 13 is a cross-sectional view showing a structure of a reflective mask blank of a sixth embodiment according to this invention.

FIG. 13 is a cross-sectional view showing a structure of a reflective mask blank of a sixth embodiment according to this invention.

A reflective mask blank 10F of this embodiment is a modification of the reflective mask blank 10B of the second embodiment and is a reflective mask blank, wherein a conductive film 6 is formed on the substrate 1 on the side opposite to the side where the multilayer reflective film 2 is formed and, assuming that a distance from the center of the substrate 1 to an outer peripheral end of the conductive film 6 is L(BL), a relationship of L(BL)>L(Res) is satisfied.

In this embodiment, since the outer peripheral end of the conductive film 6 should also be adjusted to the predetermined relationship (L(BL)>L(Res)) with the outer peripheral end of the resist film 5, the film forming method provided with the shielding member 50 as shown in FIG. 8, for example, can be applied to the formation of the conductive film 6. By providing the shielding member 50 so as to be spaced apart from a peripheral edge portion of the substrate 1, sputtered particles from the sputtering target 40 are prevented from being deposited on the peripheral edge portion of the substrate 1 so that the conductive film 6 is not formed in the outer peripheral region of the substrate 1.

Figure 14:
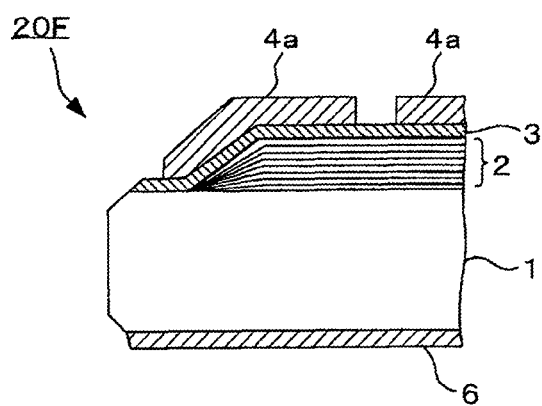
FIG. 14 is a cross-sectional view showing a structure of a reflective mask obtained using the reflective mask blank of the sixth embodiment.

FIG. 14 is a cross-sectional view showing a structure of a reflective mask 20F obtained using the reflective mask blank 10F of the sixth embodiment shown in FIG. 13.

When manufacturing a reflective mask using the reflective mask blank 10F, in the same manner as described earlier, first, the resist film 5 is subjected to desired electron beam writing and to development, thereby forming a resist pattern. Then, using the resist pattern as a mask, the absorber film 4 is dry-etched to form an absorber film pattern 4a. Consequently, the reflective mask 20F having a structure in which the absorber film pattern 4a is formed over the multilayer reflective film 2 and its protective film 3 is obtained.

As is also clear from FIG. 14, in the case where the reflective mask 20F is manufactured using the reflective mask blank 10F of this embodiment satisfying the above-described predetermined relationship regarding the forming regions of the respective films forming the reflective mask blank, when manufacturing a semiconductor device by holding the back surface of the reflective mask 20F using an electrostatic chuck and transferring a pattern to a transfer target substrate by an EUV exposure apparatus, even if light in the vacuum ultraviolet region, other than EUV light, is incident on the substrate peripheral edge portion, where the absorber film pattern 4a of the reflective mask 20F is not formed and the substrate 1 is exposed, and enters the substrate, since the conductive film 6 is formed on the back surface of the substrate, the light in the vacuum ultraviolet region (wavelength 190 to 400 nm) is not irradiated to the electrostatic chuck of the EUV exposure apparatus. Therefore, it is possible to prevent damage to the electrostatic chuck due to such light.

Also in this embodiment, a reflection reducing layer configured to reduce reflection of light having a wavelength in the vacuum ultraviolet region can be provided on a surface, on the glass substrate side, of the conductive film 6. In this case, when manufacturing a semiconductor device by holding the back surface of the reflective mask 20F using an electrostatic chuck and transferring a pattern to a transfer target substrate by an EUV exposure apparatus, even if light in the vacuum ultraviolet region, other than EUV light, is incident on the substrate peripheral edge portion, where the absorber film pattern 4a of the reflective mask 20F is not formed and the substrate 1 is exposed, and enters the substrate, since the reflection reducing layer configured to reduce reflection of light having a wavelength in the vacuum ultraviolet region is formed on the back surface of the substrate, there does not arise a problem that an unnecessary resist on the transfer target substrate is sensitized to cause degradation of pattern accuracy. As the conductive film 6 formed with the reflection reducing layer on its surface on the glass substrate side, it may have a laminated structure of, from the glass substrate side, a reflection reducing layer and a conductive layer for facilitating vacuum chucking.

As a material of the reflection reducing layer in this embodiment, the same material as in the case of the fifth embodiment described above can be preferably cited.

Also in the reflective mask 20F obtained using the reflective mask blank 10F of the sixth embodiment described above, since the multilayer reflective film is not exposed at the substrate peripheral edge portion where the absorber film pattern is not formed, it is possible to prevent peeling-off of the multilayer reflective film due to cleaning or the like in the mask manufacturing process or during mask use and further to eliminate the occurrence of a defect due to peeling-off of the multilayer reflective film.

This invention also provides a reflective mask blank according to any of the Structures 1 to 5, wherein the substrate is a glass substrate from which hydrogen contained therein has been eliminated by applying at least heat energy or light energy thereto and wherein a conductive film made of a material containing tantalum (Ta) and substantially free of hydrogen is formed on a surface, on the side opposite to a surface on which the multilayer reflective film is formed, of the glass substrate.

With this structure, using the glass substrate from which hydrogen contained therein has been eliminated by applying at least heat energy or light energy thereto, it can be suppressed that the film stress of the Ta-based conductive film formed on the other main surface of the glass substrate increases a tendency of compressive stress with time so that the flatness changes with time.

Further, this invention also provides a method of manufacturing a reflective mask blank according to any of the Structures 6 to 12, wherein a glass substrate is used as the substrate and wherein, after eliminating hydrogen contained in the glass substrate by applying at least heat energy or light energy thereto, the multilayer reflective film, the protective film, the absorber film, and the resist film are respectively formed on one of main surfaces of the glass substrate, while a conductive film made of a material containing tantalum (Ta) and substantially free of hydrogen is formed on the other main surface of the glass substrate.

According to this structure, by eliminating hydrogen contained in the glass substrate by applying at least heat energy or light energy thereto, it can be suppressed that the film stress of the Ta-based conductive film formed on the other main surface of the glass substrate increases a tendency of compressive stress with time so that the flatness changes with time.

EXAMPLES

Hereinbelow, the embodiments of this invention will be described in further detail with reference to Examples.

Example 1

A $SiO_2$—$TiO_2$-based glass substrate (size: about 152.4 mm×about 152.4 mm, thickness: about 6.35 mm) was prepared, wherein surfaces of the substrate were polished stepwise with cerium oxide abrasive particles and colloidal silica abrasive particles using a double-side polishing machine and then were surface-treated with low-concentration fluorosilicic acid.

The flatness of the obtained glass substrate was measured. As a result, in a 142 mm×142 mm measurement region, the flatness was 100 nm or less and thus was excellent. Further, in a 1 μm×1 μm measurement region, the surface roughness was 0.08 nm in root mean square roughness RMS and thus was extremely excellent.

Further, in a 1 μm×1 μm measurement region, the maximum surface roughness (Rmax) was 0.60 nm and thus Rmax/RMS was 7.5. Accordingly, variation in surface roughness was satisfactorily small.

Then, the glass substrate was placed in a heating furnace and a heat treatment was carried out at a heating temperature of 550° C. for 45 minutes while a gas inside the furnace was set to be the same as a gas outside the furnace (air in a clean room). Further, the glass substrate after the heat treatment was subjected to cleaning with a detergent and rinsing with pure water and further was irradiated with a Xe excimer lamp in the atmosphere, thereby cleaning main surfaces of the glass substrate with ultraviolet light and $O_3$ produced by ultraviolet light.

The hydrogen concentration in the glass substrate after the cleaning was measured by HFS (hydrogen forward scattering spectrometry). As a result, the hydrogen content was a detection lower limit or less.

Then, using an ion-beam sputtering apparatus, given that a Si film (thickness: 4.2 nm) and a Mo film (thickness: 2.8 nm) formed one cycle, Si films and Mo films were laminated by 40 cycles to form a multilayer reflective film (total thickness: 280 nm) on the glass substrate, thereby obtaining a multilayer reflective film coated substrate. In order to prevent film formation in a predetermined region of a substrate peripheral edge portion, the formation of the multilayer reflective film was carried out by the foregoing film forming method provided with the shielding member as shown in FIG. 7.

Then, using a DC magnetron sputtering apparatus, a protective film (thickness: 2.5 nm) made of RuNb was formed on the multilayer reflective film and further an absorber film in the form of a laminate of a TaBN film (thickness: 56 nm) and a TaBO film (thickness: 14 nm) was formed on the protective film. In order to prevent film formation in a predetermined region of the substrate peripheral edge portion, the formation of each of the protective film and the absorber film was carried out by the foregoing film forming method provided with the shielding member as shown in FIG. 8. Further, using the DC magnetron sputtering apparatus, a TaN conductive film (thickness: 20 nm) was formed on a back surface of the substrate.

Then, as a resist film, a positive resist film for electron beam writing was formed to a thickness of 120 nm on a surface of the absorber film. The resist film was formed by spin coating using a spinner (spin coating apparatus). Then, the resist film formed in a region of 1 mm inward from an outer peripheral end of the substrate was removed using the foregoing method described in Japanese Patent (JP-B) No. 3607903.

With respect to the multilayer reflective film, the protective film, the absorber film, and the resist film formed on one of the main surfaces of the substrate as described above, these films were respectively formed so as to satisfy the foregoing relationship of L(Abs)>L(Res)>L(Cap)≥L(ML), wherein L(Abs):75.5 mm, L(Res):75 mm, L(Cap):74.5 mm, and L(ML):74.5 mm.

In this manner, an EUV reflective mask blank having a structure, for example, as shown in FIG. 1 was obtained.

Then, using this EUV reflective mask blank, an EUV reflective mask was manufactured.

First, a mask pattern was written on the resist film of the EUV reflective mask blank by an electron beam writing apparatus and then development was carried out, thereby forming a resist pattern.

Then, using the resist pattern as a mask, the TaBO film of the absorber film was etched with a fluorine-based gas ($CF_4$ gas) while the TaBN film of the absorber film was etched with a chlorine-based gas ($Cl_2$ gas), thereby forming an absorber film pattern on the protective film.

Then, the resist pattern remaining on the absorber film pattern was removed by hot sulfuric acid, thereby obtaining an EUV reflective mask as shown in FIG. 2 described earlier.

Defect inspection was carried out for the obtained EUV reflective mask using a mask defect inspection apparatus (Teron 600 Series manufactured by KLA-Tencor Corporation).

Then, this obtained reflective mask was subjected to wet cleaning using a sulfuric acid hydrogen peroxide mixture and an ammonia hydrogen peroxide mixture. As sulfuric acid hydrogen peroxide mixture cleaning conditions, use was made of a sulfuric acid hydrogen peroxide mixture in which sulfuric acid (98 mass %) and hydrogen peroxide (30 mass %) were mixed in a mixing ratio of 4:1, the temperature was set to 90° C., and the time was set to 20 minutes. As ammonia hydrogen peroxide mixture cleaning conditions, use was made of an ammonia hydrogen peroxide mixture in which ammonia (29 mass %), hydrogen peroxide (30 mass %), and water were mixed in a mixing ratio of 1:1:5, the temperature was set to 70° C., and the time was set to 20 minutes.

Defect inspection was carried out also for the EUV reflective mask after the wet cleaning using the mask defect inspection apparatus (Teron 600 Series manufactured by KLA-Tencor Corporation). Defect inspection results before and after the wet cleaning were compared to each other. As a result, a defect increase due to the cleaning was not particularly confirmed.

Temporal change in the flatness of the reflective mask was also examined and it was hardly observed.

When the reflective mask of this Example thus obtained is set in an exposure apparatus to carry out pattern transfer onto a semiconductor substrate formed with a resist film, excellent pattern transfer can be carried out with no defect of a transfer pattern due to the reflective mask.

Example 2

A protective film was formed in the same manner as in Example 1 except that an alloy composed of ruthenium (Ru) and cobalt (Co), being a complete solid solution, was used as the protective film in Example 1. In this Example, with respect to a multilayer reflective film, a protective film, an absorber film, and a resist film formed on one of main surfaces of a substrate, these films were respectively formed so as to satisfy the relationship of L(Abs)≥L(Cap)>L(Res)>L(ML), wherein L(Abs):75.5 mm, L(Cap):75.5 mm, L(Res):75 mm, and L(ML):74.5 mm.

In the same manner as in Example 1 except for the above, an EUV reflective mask blank having a structure, for example, as shown in FIG. 3 was obtained.

Then, using this EUV reflective mask blank, an EUV reflective mask was manufactured in the same manner as in Example 1, thereby obtaining an EUV reflective mask as shown in FIG. 4 described earlier.

Defect inspection was carried out for the obtained EUV reflective mask using a mask defect inspection apparatus (Teron 600 Series manufactured by KLA-Tencor Corporation).

Then, this obtained reflective mask was subjected to wet cleaning using a sulfuric acid hydrogen peroxide mixture and an ammonia hydrogen peroxide mixture in the same manner as in Example 1. The wet cleaning was repeated 5 times.

Defect inspection was carried out also for the EUV reflective mask after the wet cleaning using the mask defect inspection apparatus (Teron 600 Series manufactured by KLA-Tencor Corporation). Defect inspection results before and after the wet cleaning were compared to each other. As a result, a defect increase due to the cleaning was not particularly confirmed.

When the reflective mask of this Example thus obtained is set in an exposure apparatus to carry out pattern transfer onto a semiconductor substrate formed with a resist film, excellent pattern transfer can be carried out with no defect of a transfer pattern due to the reflective mask.

Comparative Example 1

In this Comparative Example, with respect to a multilayer reflective film, a protective film, an absorber film, and a resist film formed on one of main surfaces of a substrate, these films were respectively formed so as to satisfy a relationship of L(Abs)≥L(Cap)>L(ML)>L(Res), wherein L(Abs):75.5 mm, L(Cap):75.5 mm, L(ML):75 mm, and L(Res):74.5 mm.

Materials of the respective films were the same as in Example 1.

Figure 9:
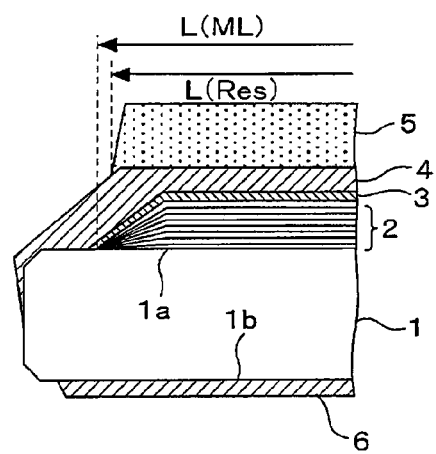
FIG. 9 is a cross-sectional view showing a structure of a reflective mask blank of a Comparative Example.

In the same manner as in Example 1 except for the above, an EUV reflective mask blank having a structure as shown in FIG. 9 was obtained.

Figure 10:
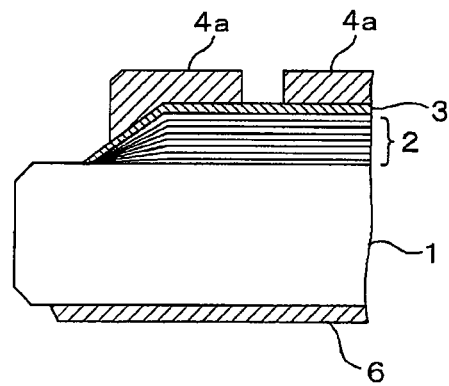
FIG. 10 is a cross-sectional view showing a structure of a reflective mask obtained using the reflective mask blank of the Comparative Example.

Then, using this EUV reflective mask blank, an EUV reflective mask was manufactured in the same manner as in Example 1, thereby obtaining an EUV reflective mask as shown in FIG. 10.

Defect inspection was carried out for the obtained EUV reflective mask using a mask defect inspection apparatus (Teron 600 Series manufactured by KLA-Tencor Corporation).

Then, this obtained reflective mask was subjected to wet cleaning using a sulfuric acid hydrogen peroxide mixture and an ammonia hydrogen peroxide mixture in the same manner as in Example 1.

Defect inspection was carried out also for the EUV reflective mask after the wet cleaning using the mask defect inspection apparatus (Teron 600 Series manufactured by KLA-Tencor Corporation). Defect inspection results before and after the wet cleaning were compared to each other. As a result, the number of increased defects due to the cleaning was 243 and thus the number of defects was largely increased.

As a result of examining these defect portions in detail, it was found that the defects were mainly due to peeling-off of the multilayer reflective film at a substrate peripheral edge portion. This is considered to be because, in the reflective mask of this Comparative Example, as is also clear from FIG. 10, the protective film at the substrate peripheral edge portion is exposed after the mask is manufactured, and therefore, when the protective film is damaged due to the cleaning or the like, peeling-off of the exposed underlying multilayer reflective film tends to occur.

Example 3

An EUV reflective mask blank was manufactured in the same manner as in Example 1 except that, in order to prevent film formation in a predetermined region of the substrate peripheral edge portion, the formation of the conductive film was carried out in Example 1 by the foregoing film forming method provided with the shielding member as shown in FIG. 8.

The conductive film was set to L(BL):75.5 mm and was formed so as to satisfy the relationship of L(BL)>L(Res) with the resist film.

In this manner, an EUV reflective mask blank having a structure as shown in FIG. 11 was obtained.

Then, using this EUV reflective mask blank, an EUV reflective mask was manufactured in the same manner as in Example 1, thereby obtaining an EUV reflective mask as shown in FIG. 12 described earlier.

Defect inspection was carried out for the obtained EUV reflective mask using a mask defect inspection apparatus (Teron 600 Series manufactured by KLA-Tencor Corporation).

Then, this obtained reflective mask was subjected to wet cleaning using a sulfuric acid hydrogen peroxide mixture and an ammonia hydrogen peroxide mixture in the same manner as in Example 1. The wet cleaning was repeated 5 times.

Defect inspection was carried out also for the EUV reflective mask after the wet cleaning using the mask defect inspection apparatus (Teron 600 Series manufactured by KLA-Tencor Corporation). Defect inspection results before and after the wet cleaning were compared to each other. As a result, a defect increase due to the cleaning was not particularly confirmed.

When the reflective mask of this Example thus obtained is set in an exposure apparatus to carry out pattern transfer onto a semiconductor substrate formed with a resist film, excellent pattern transfer can be carried out with no defect of a transfer pattern due to the reflective mask. Further, even if light in the vacuum ultraviolet region, other than EUV light, is incident on the substrate peripheral edge portion, where the substrate is exposed, and enters the substrate, since the conductive film is formed on the back surface of the substrate, the light is not irradiated to an electrostatic chuck of the exposure apparatus.

Example 4

An EUV reflective mask blank and an EUV reflective mask were manufactured in the same manner as in Example 3 except that a Ta$_2$O$_5$ film (thickness: 50 nm) as a reflection reducing layer, described earlier, and a TaN film (thickness: 20 nm) were formed from the substrate side as the conductive film in Example 3.

Defect inspection was carried out for the obtained EUV reflective mask using a mask defect inspection apparatus (Teron 600 Series manufactured by KLA-Tencor Corporation).

Then, this obtained reflective mask was subjected to wet cleaning using a sulfuric acid hydrogen peroxide mixture and an ammonia hydrogen peroxide mixture in the same manner as in Example 1. The wet cleaning was repeated 5 times.

Defect inspection was carried out also for the EUV reflective mask after the wet cleaning using the mask defect inspection apparatus (Teron 600 Series manufactured by KLA-Tencor Corporation). Defect inspection results before and after the wet cleaning were compared to each other. As a result, a defect increase due to the cleaning was not particularly confirmed.

When the reflective mask of this Example thus obtained is set in an exposure apparatus to carry out pattern transfer onto a semiconductor substrate formed with a resist film, excellent pattern transfer can be carried out with no defect of a transfer pattern due to the reflective mask. Further, even if light in the vacuum ultraviolet region, other than EUV light, is incident on the substrate peripheral edge portion, where the substrate is exposed, and enters the substrate, since the conductive film provided with the reflection reducing layer is formed on the back surface of the substrate, it is prevented that an unnecessary resist on a transfer target substrate is sensitized to cause degradation of pattern accuracy, and therefore, excellent pattern transfer can be carried out.

DESCRIPTION OF SYMBOLS 1 substrate (glass substrate)
2 multilayer reflective film
3 protective film
4 absorber film
5 resist film
6 conductive film
10A, 10B, 10C, 10D, 10E, 10F reflective mask blank
20A, 20B, 20E, 20F reflective mask blank
30, 50 shielding member
40 sputtering target

The invention claimed is:

1. A reflective mask blank, comprising:
a substrate;
a multilayer reflective film formed on the substrate to reflect EUV light;
an absorber film formed over the multilayer reflective film to absorb the EUV light; and
a resist film formed on the absorber film;
wherein:
when a distance from a center of the substrate to an outer peripheral end of the multilayer reflective film is L (ML), a distance from the center of the substrate to an outer peripheral end of the absorber film is L(Abs), and a distance from the center of the substrate to an outer peripheral end of the resist film is L(Res),
L(Abs)>L(Res)>L(ML) is satisfied and the outer peripheral end of the resist film is located inward of an outer peripheral end of the substrate.

2. The reflective mask blank according to claim 1, wherein a protective film is formed between the multilayer reflective film and the absorber film to protect the multilayer reflective film, and
wherein:

when a distance from the center of the substrate to an outer peripheral end of the protective film is L(Cap), L(Res)>L(Cap)≥L(ML) is satisfied.

3. The reflective mask blank according to claim 1, wherein a protective film is formed between the multilayer reflective film and the absorber film to protect the multilayer reflective film, and
wherein:
when a distance from the center of the substrate to an outer peripheral end of the protective film is L(Cap), L(Abs)≥L(Cap)>L(Res) is satisfied.

4. The reflective mask blank according to claim 1, wherein a conductive film is formed on the substrate of a side opposite to a side where the multilayer reflective film is formed, and
wherein:
when a distance from the center of the substrate to an outer peripheral end of the conductive film is L(BL), L(BL)>L(Res) is satisfied.

5. The reflective mask blank according to claim 4, wherein a reflection reducing layer for reducing reflection of light having a wavelength in a vacuum ultraviolet region is formed on a substrate side of the conductive film.

6. The reflective mask blank according to claim 2, wherein the protective film is made of an alloy of at least two kinds of metals including ruthenium (Ru) and the alloy is a complete solid solution.

7. The reflective mask blank according to claim 3, wherein the protective film is made of an alloy of at least two kinds of metals including ruthenium (Ru) and the alloy is a complete solid solution.

8. A method of manufacturing a reflective mask blank, the reflective mask blank comprising a substrate; a multilayer reflective film formed on the substrate to reflect EUV light; an absorber film formed over the multilayer reflective film to absorb the EUV light; and a resist film formed on the absorber film;
wherein:
when a distance from a center of the substrate to an outer peripheral end of the multilayer reflective film is L (ML), a distance from the center of the substrate to an outer peripheral end of the absorber film is L(Abs), and a distance from the center of the substrate to an outer peripheral end of the resist film is L(Res),
the multilayer reflective film, the absorber film, and the resist film are respectively formed so that L(Abs)>L(Res)>L(ML) is satisfied and that the outer peripheral end of the resist film is located inward of an outer peripheral end of the substrate.

9. The method of manufacturing a reflective mask blank according to claim 8, wherein a protective film is formed between the multilayer reflective film and the absorber film to protect the multilayer reflective film, and
wherein:
when a distance from the center of the substrate to an outer peripheral end of the protective film is L(Cap), L(Res)>L(Cap)≥L(ML) is satisfied.

10. The method of manufacturing a reflective mask blank according to claim 8, wherein a protective film is formed between the multilayer reflective film and the absorber film to protect the multilayer reflective film, and
wherein:
when a distance from the center of the substrate to an outer peripheral end of the protective film is L(Cap), L(Abs)≥L(Cap)>L(Res) is satisfied.

11. The method of manufacturing a reflective mask blank according to claim 9, wherein the multilayer reflective film, the protective film, and the absorber film are formed by sputtering by providing a shielding member so as to be spaced apart from a peripheral edge portion of the substrate.

12. The method of manufacturing a reflective mask blank according to claim 10, wherein the multilayer reflective film, the protective film, and the absorber film are formed by sputtering by providing a shielding member so as to be spaced apart from a peripheral edge portion of the substrate.

13. The method of manufacturing a reflective mask blank according to claim 8, wherein a conductive film is formed on the substrate of a side opposite to a side where the multilayer reflective film is formed, and
wherein:
when a distance from the center of the substrate to an outer peripheral end of the conductive film is L(BL), L(BL)>L(Res) is satisfied.

14. The method of manufacturing a reflective mask blank according to claim 13, wherein the conductive film is formed by sputtering by providing a shielding member so as to be spaced apart from a peripheral edge portion of the substrate.

15. The method of manufacturing a reflective mask blank according to claim 13, wherein a reflection reducing layer for reducing reflection of light having a wavelength in a vacuum ultraviolet region is formed on a substrate side of the conductive film.

16. The method of manufacturing a reflective mask blank according to claim 9, wherein the protective film is made of an alloy of at least two kinds of metals including ruthenium (Ru) and the alloy is a complete solid solution.

17. The method of manufacturing a reflective mask blank according to claim 10, wherein the protective film is made of an alloy of at least two kinds of metals including ruthenium (Ru) and the alloy is a complete solid solution.

18. A method of manufacturing a reflective mask, comprising:
using the reflective mask blank according to claim 1,
a step of forming a resist pattern in the resist film; and
a step of patterning the absorber film by using the resist pattern as a mask.

19. A method of manufacturing a semiconductor device, comprising:
a step of forming a transfer pattern in a resist film on a semiconductor substrate by using the reflective mask obtained by the method of manufacturing the reflective mask according to claim 18.

* * * * *